United States Patent
Boianceanu et al.

(10) Patent No.: US 11,127,853 B2
(45) Date of Patent: Sep. 21, 2021

(54) POWER TRANSISTOR DEVICE INCLUDING FIRST AND SECOND TRANSISTOR CELLS HAVING DIFFERENT ON-RESISTANCES FOR IMPROVED THERMAL STABILITY

(71) Applicant: Infineon Technologies AG, Neubiberg (DE)

(72) Inventors: Cristian Mihai Boianceanu, Bucharest (RO); Liu Chen, Oberhaching (DE); Sebastian Sosin, Bucharest (RO); Andrew Christopher Graeme Wood, St. Jakob im Rosental (AT)

(73) Assignee: Infineon Technologies AG, Neubiberg (DE)

( * ) Notice: Subject to any disclaimer, the term of this patent is extended or adjusted under 35 U.S.C. 154(b) by 117 days.

(21) Appl. No.: 16/433,889

(22) Filed: Jun. 6, 2019

(65) Prior Publication Data
US 2019/0386133 A1   Dec. 19, 2019

(30) Foreign Application Priority Data
Jun. 18, 2018   (DE) .......................... 102018114591.8

(51) Int. Cl.
| | |
|---|---|
| *H01L 29/78* | (2006.01) |
| *H01L 29/423* | (2006.01) |
| *H01L 27/088* | (2006.01) |
| *H01L 29/06* | (2006.01) |

(52) U.S. Cl.
CPC ........ *H01L 29/7813* (2013.01); *H01L 27/088* (2013.01); *H01L 29/0696* (2013.01); *H01L 29/4236* (2013.01); *H01L 29/7811* (2013.01)

(58) Field of Classification Search
CPC ............. H01L 29/7813; H01L 29/0696; H01L 29/4236; H01L 29/7811; H01L 29/7802; H01L 27/088
See application file for complete search history.

(56) References Cited

U.S. PATENT DOCUMENTS

| | | | |
|---|---|---|---|
| 4,931,844 A | 6/1990 | Zommer | |
| 5,097,302 A | 3/1992 | Fujihira et al. | |
| 5,543,632 A | 8/1996 | Ashley | |
| 2013/0154000 A1* | 6/2013 | Shinbori | ............... H01L 29/407 257/334 |
| 2015/0069567 A1* | 3/2015 | Yedinak | .............. H01L 29/7813 257/493 |
| 2015/0129895 A1* | 5/2015 | Takeuchi | ............ H01L 29/7811 257/77 |
| 2018/0122931 A1* | 5/2018 | Siemieniec | ......... H01L 29/1608 |

\* cited by examiner

*Primary Examiner* — Matthew E. Gordon
(74) *Attorney, Agent, or Firm* — Murphy, Bilak & Homiller, PLLC

(57) ABSTRACT

A transistor device is disclosed. The transistor device includes: a semiconductor body; a source conductor on top of the semiconductor body; a source clip on top of the source conductor and electrically connected to the source conductor; a first active device region arranged in the semiconductor body, covered by the source conductor and the source clip, and including at least one device cell; and a second active device region arranged in the semiconductor body, covered by regions of the source conductor that are not covered by the source clip, and including at least one device cell. The first active device region has a first area specific on-resistance and the second active device region has a second area specific on-resistance, the second area specific on-resistance being greater than the first area specific on-resistance.

15 Claims, 11 Drawing Sheets

H-H

POWER TRANSISTOR DEVICE INCLUDING FIRST AND SECOND TRANSISTOR CELLS HAVING DIFFERENT ON-RESISTANCES FOR IMPROVED THERMAL STABILITY

TECHNICAL FIELD

This disclosure in general relates to a transistor device, in particular, a power transistor device.

BACKGROUND

Power transistor devices, such as MOSFETs (Metal Oxide Semiconductor Field Effect Transistors) are widely used as electronic switches in various types of electronic applications. Usually, a power transistor device includes a plurality of transistor cells that are integrated in a semiconductor body. There is an ongoing effort to reduce the size of these transistor cells in order to reduce the size of the overall transistor device while maintaining a given rated current.

Reducing the size of a power transistor, however, may deteriorate the temperature management of the transistor device. Basically, it is desirable to operate the transistor device in a thermally stable state. The transistor device is thermally stable when an increasing temperature of the transistor device results in a decreasing current through the transistor device. The transistor device is thermally unstable when an increasing temperature results in an increasing current. In this case, the increasing current may further increase the temperature, which may again increase the current, and so on. For a given transistor device there may be a current density limit, wherein the device is thermally stable at current densities above the current density limit and thermally unstable at current densities below the current density limit. This current density limit may be referred to as the Temperature Compensation Point (TCP). It has been observed that reducing the size of the transistor cells of a power transistor often results in an increase in the current density limit, which is equivalent to an increase in the current range in which the transistor device is thermally unstable.

SUMMARY

One example relates to a transistor device. The transistor device includes a semiconductor body, a source conductor on top of the semiconductor body, a source clip on top of the source conductor and, electrically connected to the source conductor, a first active device region arranged in the semiconductor body, and a second active device region arranged in the semiconductor body. The first active device region is covered by the source conductor and the source clip and includes at least one device cell, and the second active device region is covered by regions of the source conductor that are not covered by the source clip and includes at least one device cell. Further, the first active device region has a first area specific on-resistance and the second active device region has a second area specific on-resistance, wherein the second area specific on-resistance is greater than the first area specific on-resistance.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
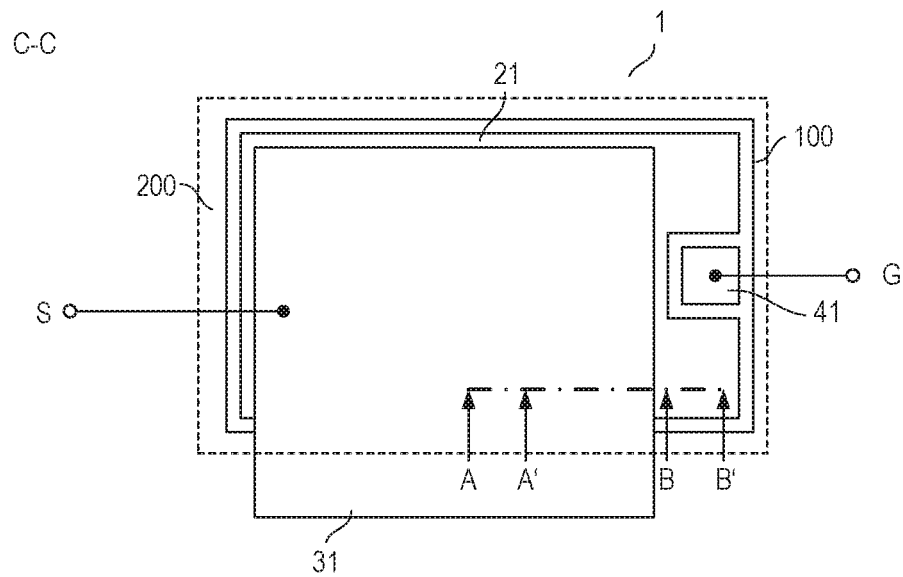
FIG. 1 shows a top view of a transistor device that includes a source conductor on top of a semiconductor body and a source clip mounted on the source conductor.
Figure 2:
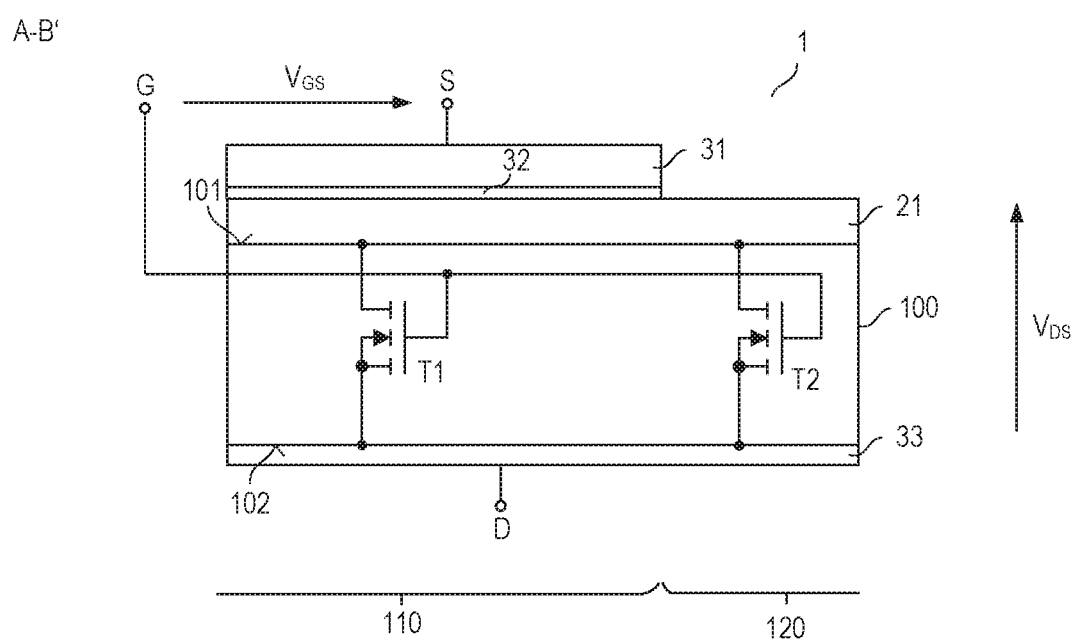
FIG. 2 schematically illustrates a vertical cross sectional view of one section of the transistor device.

FIG. 1 shows a top view of a transistor device according to one example, and FIG. 2 shows a vertical cross sectional view of one section of the transistor device 1 along a section plane A-B' shown in FIG. 1. Referring to FIGS. 1 and 2, the transistor device includes a semiconductor body 100, a source conductor 21 (which may also be referred to as source metallization or source pad), on top of the semiconductor body 100, and a source clip 31 on top of the source conductor 21 and electrically connected to the source conductor 21. According to one example, the semiconductor body 100 is a monocrystalline semiconductor body made of silicon (Si), silicon carbide (SiC), gallium nitride (GaN), gallium arsenide (GaAs), or the like. The source conductor 21 includes an electrically conducting material such as a metal. According to one example, the source conductor 21 includes at least one of copper (Cu) and aluminium (Al). According to one example, the source conductor 21 is a homogeneous layer made of one electrically conducting material such as, for example copper (Cu), aluminum (Al), or an aluminium-copper alloy (AlCu). According to another example, the source conductor 21 includes a layer stack having at least two layers of different electrical conducting materials formed one above the other. According to one example, one of these layers is a Cu layer and another one of these layers is an AlCu layer. According to one example, at least one interface layer (not shown in the drawings) is formed between the source conductor 21 and the semiconductor body 100. According to one example, the at least one interface layer includes a first layer of titanium (Ti) or titanium nitride (TiN) on top of the semiconductor body 100 and a second layer of tungsten (W) between the first layer and the source conductor. The first layer may have a thickness of between 10 nanometers and 60 nanometers, and the second layer may have a thickness of between 300 nanometers and 700 nanometers. According to a further example, the source conductor 21 is covered by a protective coat (not shown) that inhibits oxidation and may assist in soldering the source clip 31 to the source conductor 21.

The source clip 31 is made of an electrically conducting material. According to one example, the electrically conducting material is copper (Cu) or aluminium (Al). However, other electrically conducting materials may be used as well.

Referring to the above, the source clip 31 is electrically connected to the source conductor 21. According to one example, an electrically conducting connection layer 32 is formed between the source conductor 21 and the source clip 31 and electrically connects the source clip 31 to the source conductor 21. This connection layer 32 may be a solder layer or may include an electrically conducting adhesive. The solder layer may include at least one of tin (Sn), lead (Pb), and zinc (Zn).

Referring to FIG. 2, the transistor device 1 further includes a first active device region (which may also be referred to as first active transistor region) and a second active device region (which may also be referred to as second active transistor region), wherein each of these first and second active device regions 110, 120 includes at least one transistor cell that has a load path (drain-source path) connected between the source conductor 21 formed on top of a first surface 101 of the semiconductor body 100 and a drain electrode 33 formed on top of a second surface 102 of the semiconductor body 100. In FIG. 2, a circuit symbol of a MOSFET T1 represents the at least one transistor cell of the first active device region 110 and a circuit symbol of a second MOSFET T2 represents the at least one transistor cell of the second active device region 120. Just for the purpose of illustration, the MOSFETs T1, T2 illustrated in FIG. 2 are n-type enhancement MOSFETs, so that the transistor device 1 is an n-type enhancement MOSFET in this example. This, however, is only an example. The transistor device 1 may also be implemented as an n-type depletion MOSFET, a p-type enhancement MOSFET, a p-type depletion MOSFET, or an IGBT.

The transistor device 1 switches on or off dependent on a drive voltage (gate-source voltage) $V_{GS}$ applied between a gate node G and a source node S of the transistor device 1. The source node S is formed by the source clip 31, and the gate node G is formed by a gate pad 41 which, according to one example, is also formed on top of the first surface 101. The transistor device 1 switches on when the drive voltage $V_{GS}$ is higher than a threshold voltage of the transistor device 1. In an n-type MOSFET, the threshold voltage is a positive voltage. In an on-state (switched-on state), the transistor device 1 conducts a current between a drain node D, which is formed by the drain electrode 33, and the source node S when a load path voltage (drain-source voltage) $V_{DS}$ greater than zero is applied between the drain node D and the source node S. In an off-state (switched-off state), a current flow between the drain node D and the source node S is prevented.

Referring to FIG. 2, the first active device region 110 is formed in a section of the semiconductor body 100 that is covered by both the source conductor 21 and the source clip 31. The second active device region 120 is formed in a section of the semiconductor body 100 that is covered by the source conductor 21, but not covered by the source clip 31. The at least one transistor cell (represented by the MOSFET T1 in FIG. 2) in the first active device region 110 and the at least one second transistor cell (represented by the MOSFET T2 in FIG. 2) in the second active device region 120 are implemented such that an area specific on-resistance of the second active device region 120 is greater than an area specific on-resistance of the first active device region 110. The area specific on-resistance of the first active device region 110 is also referred to as first area specific on-resistance in the following, and the area specific on-resistance of the second active device region 120 is also referred to as second area specific on-resistance in the following.

The first area specific on-resistance is given by an electrical resistance (which may also be referred to as on-resistance) $R_{DS\_ON1}$ of the at least one transistor cell implemented in the first active device region 110 in the on-state of the transistor device multiplied with an area A1 of the first active device region 110. If the first active device region 110 includes a plurality of transistor cells connected in parallel, the on-resistance is given by the electrical resistance of the parallel circuit with the transistor cells in the on-state. The area A1 of the first active device region 110 is also referred to as first area A1 in the following. Referring to the above, the first area A1 is given by an area of the semiconductor body 100 that is covered by both the source conductor 21 and the source clip 31. According to one example, this area A1 is equivalent to an area of the connection layer 32 that connects the source clip 31 to the source conductor 21. That is, only those sections of the semiconductor body 100 are considered to be covered by the source clip 31 which are covered by the region in which the source clip 31 is electrically connected to the source conductor 21 by the connection layer 32.

Equivalently, the area specific on-resistance of the second active device region 120 is given by an electrical resistance $R_{DS\_ON2}$ of the at least one transistor cell T2 in the second active device region 120 in the on-state of the transistor device multiplied with an area A2 (which is also referred to as second area A2 in the following) of a region of the semiconductor body 100 covered by the source conductor 21, but not covered by the source clip 31. It goes without saying that the second area specific on-resistance being greater than the first area specific on resistance applies to first and second area specific on-resistances occurring at the same drive voltage $V_{GS}$.

According to one example, a ratio between the second area specific on-resistance $A2 \cdot R_{DS\_ON2}$ and the first area specific on-resistance $A1 \cdot R_{DS\_ON1}$ is at least 1.2, at least 1.5, at least 2, or at least 5.

According to one example, the first area A1 is greater than the second area A2. According to one example, a ratio A1/A2 between the first area A1 and the second area A2 is greater than 5 or greater than 10.

In FIG. 2, the source conductor 21 is drawn to adjoin the first surface 101 of the semiconductor body 100. It should be noted that FIG. 2 is only a schematic illustration. Referring to examples explained in the following, there are regions of the first surface 101 of the semiconductor body 100 that are connected to the source conductor 21. However, there may also be regions in which an insulation layer is arranged between the first surface 101 of the semiconductor body 100 and the source conductor 21.

The source clip 31 forms an external connection of the transistor device 1 and may serve to connect the transistor device 1 to a supply node or another electronic device in an electronic circuit in which the transistor device 1 is used. Connecting the source clip 31 to a supply node or another electronic device may include connecting the source clip 31 to an electrically conducting trace of a printed circuit board (PCB), or the like.

The source clip 31, however, does not only have an electrical function. It has been found that the source clip 31 (as compared to bond wires, for example) improves cooling of the semiconductor body 100. In particular, the source clip 31 improves cooling of the first active device region 100, that is, the region of the semiconductor body 100 located below the source clip 31 and thermally connected to the source clip 31 via the source conductor 21 and the connection layer 32. The second active device region 120, that is the region of the semiconductor body 100 covered by the source conductor 21 but not covered by the source clip 31, has a cooling deficit as compared to the first active device region 110. It has been found that the robustness, e.g. the energy dissipation robustness or energy dissipation capability, of the transistor device 1 can be increased by implementing the second active device region 120 such that the second area specific on-resistance is greater than the first area specific on-resistance of the first active device region 110. Implementing the second active device region 120 such that the second area specific on-resistance is greater than the first area specific on-resistance has the effect that in the on-state of the transistor device 1 less power per unit area is dissipated on average in the second active device region 120 than in the first active device region 110. It should however be understood that the power dissipation in both the first and second active device regions 110 and 120 may be inhomogeneous under dynamic conditions, in which case there may be localized areas of the second active device region 120 with higher power dissipation per unit area and localized areas of the first active device region 110 with lower power dissipation per unit area. That is, at a given operating point of the transistor device, there may be an area of the second active device region 120 that has a higher power dissipation per unit area than an area of the first active device region. Nevertheless, the average power dissipation per unit area is lower in the second active device region than in the first active device region.

Figure 3:
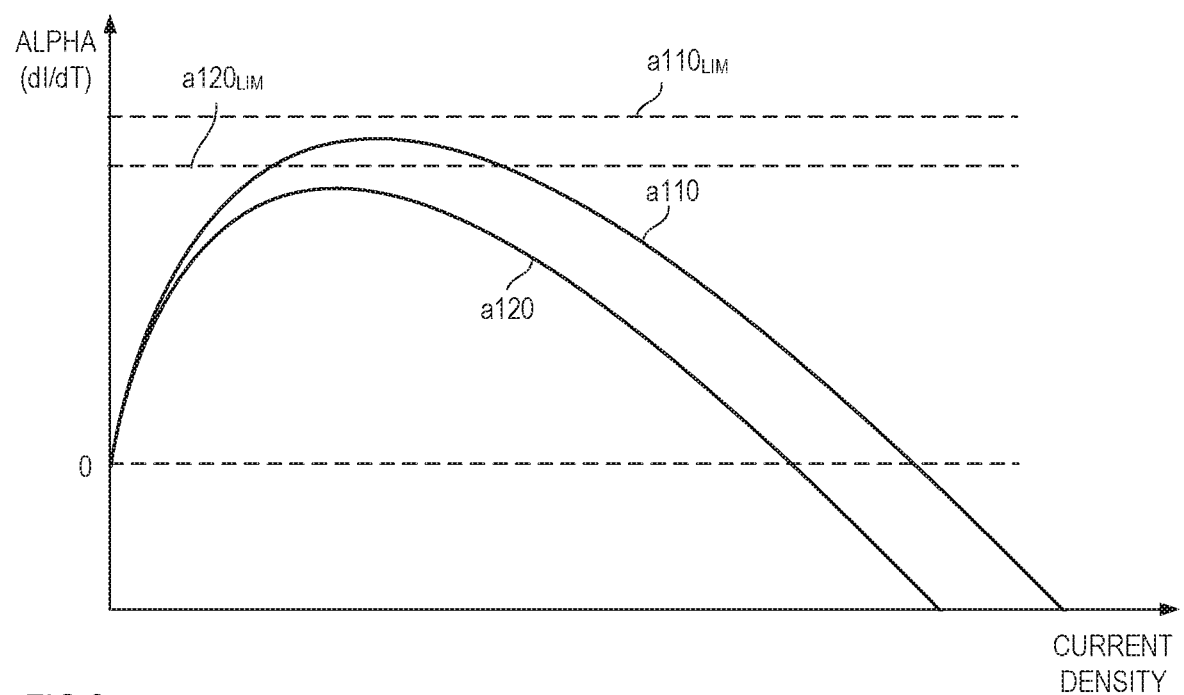
FIG. 3 shows curves that illustrate a temperature coefficient over the current density of a transistor device of the type shown in FIGS. 1 and 2.

FIG. 3 shows curves that illustrate the temperature behavior of a transistor device of the type shown in FIGS. 1 and 2. More specifically, curve a110 shown in FIG. 3 represents the temperature coefficient of the first active device region 110 and curve a120 represents the temperature coefficient of the second active device region 120. The temperature coefficient, (which is often referred to as α (alpha)), defines the change of the current (dI) dependent on a change of the temperature (dT). The temperature coefficient can be positive (>0) or negative (<0). When the temperature coefficient is positive, the current I through the transistor device increases as the temperature T increases, and when the temperature coefficient is negative, the current I decreases as the temperature increases T. Referring to FIG. 3, the temperature coefficient is dependent on a current density, which is given by the current per unit area. Further, as can be seen from FIG. 3, there is a range where the temperature coefficient increases as the current density decreases.

In general, a transistor device is thermally stable when operated at those current densities that are associated with a negative temperature coefficient. A transistor device, however, may also be thermally stable when the temperature coefficient is positive but below a predefined upper limit. It has been found that this upper limit is dependent on how well heat is transferred away from the transistor device, wherein the better heat is transferred away from transistor device, the higher the upper limit is.

In FIG. 3, $a110_{LIM}$ denotes the upper limit of the temperature coefficient of the first active device region 110 and $a120_{LIM}$ denotes the upper limit of the temperature coefficient of the second active device region 120, wherein $a110_{LIM}$ is also referred to as first upper limit and $a120_{LIM}$ is also referred to as second upper limit in the following. As can be seen from FIG. 3, the second upper limit $a120_{LIM}$ is lower than the first upper limit $a110_{LIM}$, which is due to the fact that the second active device region has a cooling deficit as compared to the first active device region 110. Further, as can be seen from FIG. 3, there are current densities at which the temperature coefficient a110 of the first active device region 110 is higher than the second upper limit $a120_{LIM}$. Thus, the transistor device would be thermally instable if the overall device, that is, the first active device region 110 and the second active device region 120 were implemented in the same fashion.

Referring to FIG. 3, however, the temperature coefficient a120 of the second active device region 120 is lower than the temperature coefficient a110 of the first active device region 110 and lower than the second upper limit $a120_{LIM}$. Thus, both the first active device region 110 and the second active device region 120 and, therefore, the overall transistor device is thermally stable.

The lower temperature coefficient of the second active device region 120 is achieved by implementing the second active device region 120 with a higher area specific on-resistance than the first active device region 110. The latter has the effect that, at a given operating point of the transistor device, the (average) current density in the second active device region 120 is lower than in the first active device region 110, so that also a change of the current at a given change of the temperature is lower in the second active device region 120 than in the first active device region 110.

The improvement of the thermal stability is associated with a (slight) increase of the on-resistance. This, however, is considered acceptable in most cases.

Figure 4:
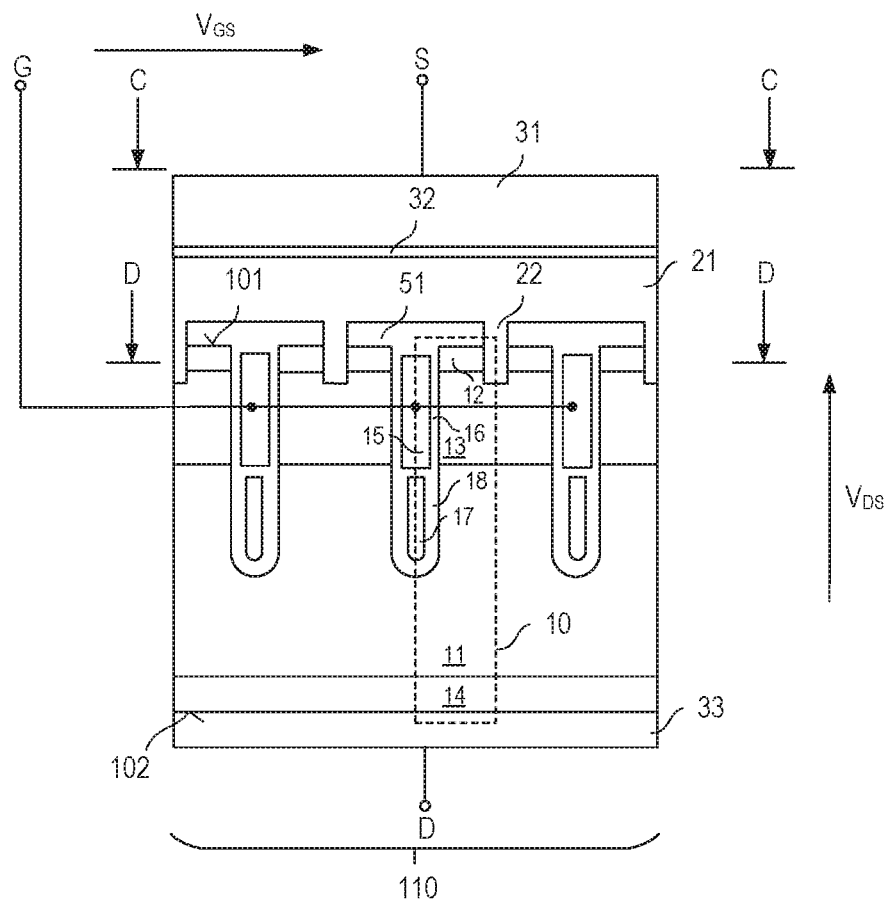
FIG. 4 illustrates a vertical cross sectional view of a first active device region and of first type transistor cells integrated in the first active device section.

Referring to the above, at least one transistor cell is integrated in the first active device region 110. According to one example, a plurality of transistor cells are integrated in the first active device region 110. FIG. 4 shows a vertical cross sectional view of one section of the active device region 110 and schematically illustrates one example of how these transistor cells 10 may be implemented. FIG. 4 shows several transistor cells, wherein the outline of one of these transistor cells is illustrated by a dashed rectangle labelled with reference number 10. Referring to FIG. 4, each of the transistor cells includes a drift region 11, a source region 12 separated from the drift region 11 by a body region 13, and a drain region 14 separated from the body region 13 by the drift region 11. Further, a gate electrode 15 is arranged adjacent the body region 13 and dielectrically insulated from the body region 13 by a gate dielectric 16. In the example shown in FIG. 4, the gate electrode 15 is arranged in a trench extending from the first surface 101 into the semiconductor body 100.

The drift region 11 is a doped semiconductor region of a first doping type (conductivity type), the source region 12 is a doped semiconductor region of the first doping type, and the body region 13 is a doped semiconductor region of a second doping type complementary to the first doping type. In a MOSFET, the drain region 14 is a doped semiconductor region of the first doping type, in an IGBT the drain region 14 is a doped semiconductor region of the second doping type. A doping concentration of the drift region 11 is, for example, selected from a range of between $1E15$ cm$^{-3}$ and $1E17$ cm$^{-3}$, the doping concentration of the source region 12 is, for example, selected from a range of between $1E19$ cm$^{-3}$ and $1E21$ cm$^{-3}$, the doping concentration of the body region 13 is, for example, selected from a range of between $1E15$ cm$^{-3}$ and $1E18$ cm$^{-3}$ and the doping concentration of the drain region 14 is, for example, selected from a range of between $1E19$ cm$^{-3}$ and $1E21$ cm$^{-3}$, wherein the ranges include the respective maximum doping concentrations In an n-type transistor device, the first doping type is an n-type and the second doping type is a p-type. In a p-type transistor device, the first doping type is a p-type and the second doping type an n-type.

Referring to FIG. 4, the drift regions 11 of the individual transistor cells 10 can be formed by one doped semiconductor region common to the transistor cells 10, and the drain regions 14 of the transistor cells 10 can be formed by another doped semiconductor region common to the transistor cells 10. Further, gate electrodes 15 of two (or more) neighboring transistor cells 10 can be formed by one common electrode and body region 13 of two (or more) other neighboring transistor cells formed by one doped semiconductor region.

The transistor cells 10 are connected in parallel wherein the source region 12 and the body region 13 of each transistor cell 10 are connected to the source conductor 21 and the common drain region 14 is connected to the drain electrode 33. In the example shown in FIG. 4, the source conductor 21 includes contact plugs 22 that extend through an insulation layer 51 formed on top of the first surface 101 of the semiconductor body 100 down to the source region 12 and the body region 13. Further, the gate electrodes 15 of the individual transistor cells 10 are electrically connected to the gate node G. A connection between the gate electrodes 15 and the gate node G, however, is only schematically illustrated in FIG. 4.

Optionally, each transistor cell 10 further includes a field electrode 17 arranged adjacent the drift region 11 and dielectrically insulated from the drift region 11 by a field electrode dielectric 18. This field electrode 17 can be electrically connected to the gate node G or the source node S. Such connection, however, is not illustrated in FIG. 4. The gate electrode 15 and the field electrode 17 may include an electrically conducting material such as a metal or a highly doped crystalline semiconductor material (such as polysilicon). The gate dielectric 16 and the field electrode dielectric 18 includes an electrically insulating material such as an oxide.

Figure 5:
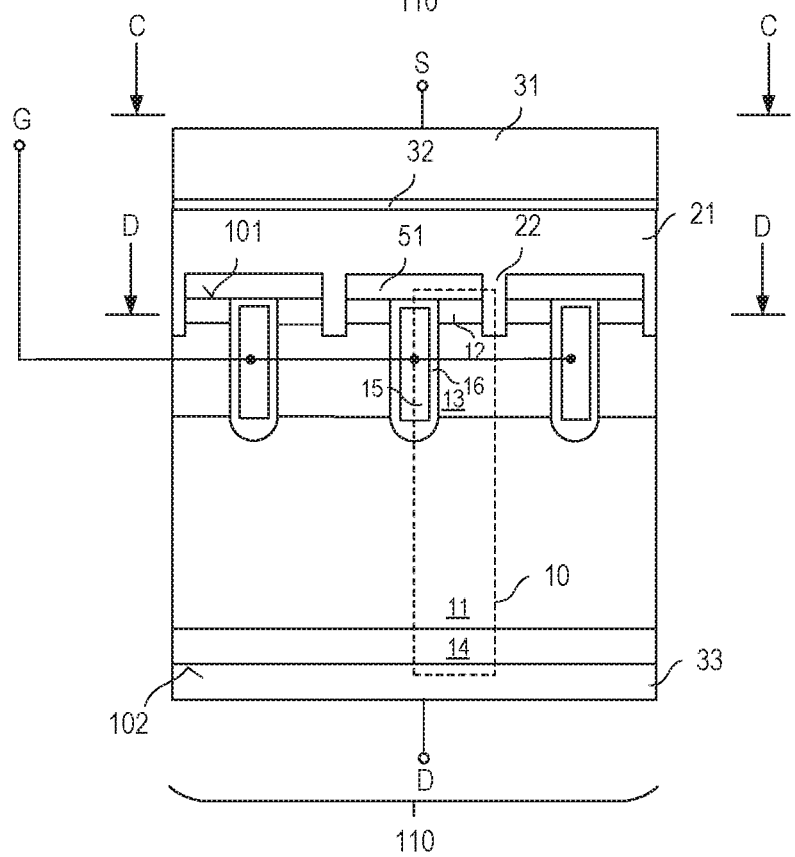
FIG. 5 illustrates a modification of the first type transistor cells shown in FIG. 4.

The field electrode 17 and the field electrode dielectric 18 shown in FIG. 4 are optional. According to another example illustrated in FIG. 5, the field electrode 17 and the field electrode dielectric 18 are omitted.

Figure 6:
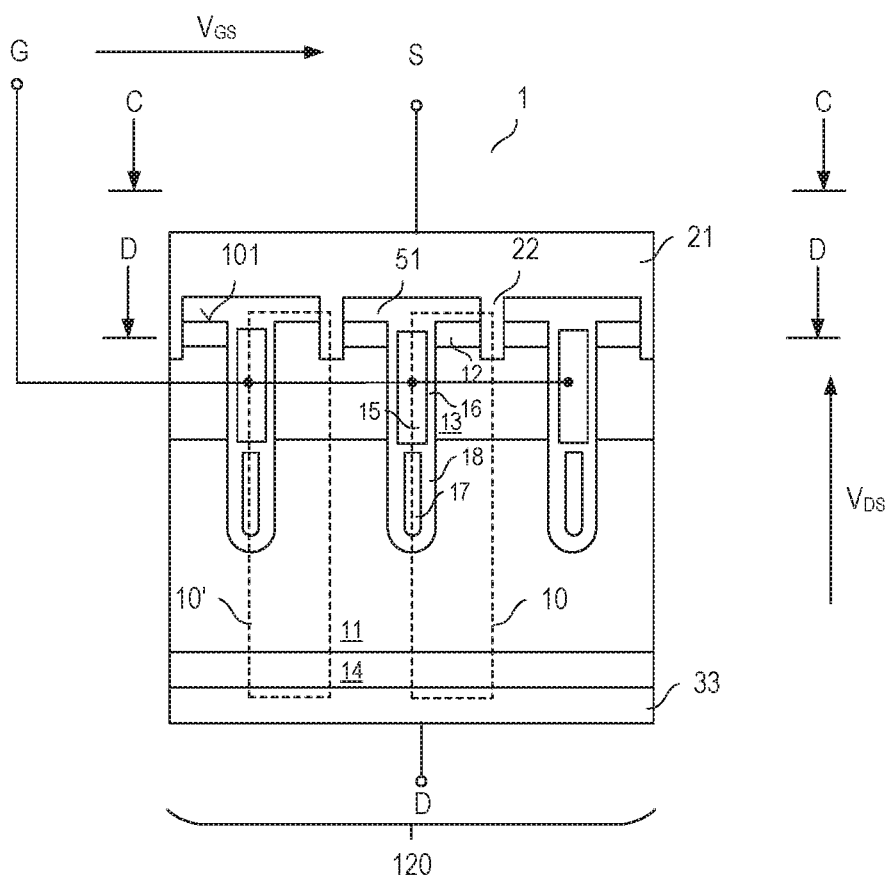
FIG. 6 illustrates a vertical cross sectional view of a second active device region and of first type transistor cells and second type transistor cells integrated in the first active device section.

FIG. 6 shows a vertical cross sectional view of one section of the second active device region 120. In this example, a plurality of transistor cells are integrated in the second active device region 120, wherein these transistor cells are connected between the source conductor 21 and the drain electrode 33 in the same way as explained with reference to FIG. 4. Further, gate electrodes of these transistor cells are connected to the gate node G. In the example shown in FIG. 6, the plurality of transistor cells integrated in the second active device region 120 includes one or more transistor cells 10 of the same type, as explained with reference to FIG. 4. These transistor cells 10 are also referred to as first type transistor cells in the following. According to one example, the first type transistor cells have the same doping concentration of their respective source region 12, the same doping concentration of their respective body region 13, the same doping concentration of their respective drift region 11, and the same doping concentration of their respective drain region 14. Further, according to one example, the first type transistor cells 10 have the same threshold voltage which, inter alia, is dependent on a thickness of the gate dielectric 16 between the gate electrode 15 and the body region 13 and on a doping concentration of the body region 13. Further, according to one example, the first type transistor cells have the same channel length, which is the length of the body region 13 along the gate dielectric 16 between the source region 12 and the drift region 11.

Referring to FIG. 6, the second active device region 120 includes at least one second type transistor cell 10'. At least one feature of the at least one second type transistor cell 10' is different from the first type transistor cells 10. In the following, only the at least one different feature is explained so that features of the second type transistor cell 10' that are not mentioned to be different are equal to corresponding features of the first type transistor cells 10.

Figures 7, 8:
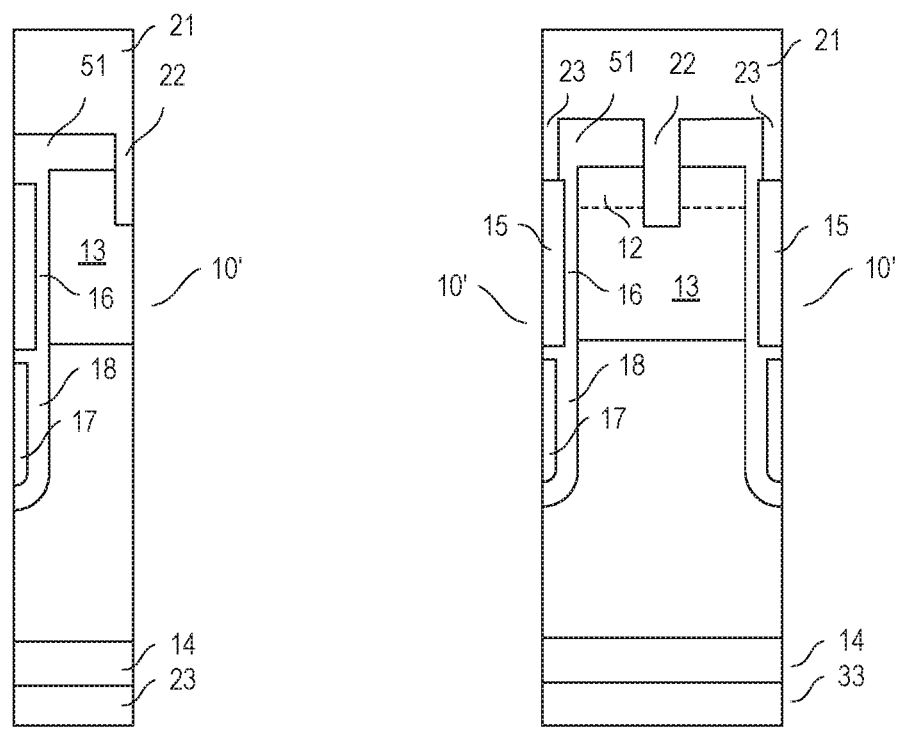
FIGS. 7 to 10 illustrate different examples of a second type transistor cell.

In the example shown in FIG. 6, the second type transistor cell 10' is different from the first type transistor cells 10 in that the source region 12 is omitted. That is, the second type transistor cell 10' includes a body region 13 connected to the source conductor 21, but does not include a source region. An enlarged view of this second type transistor cell 10' is shown in FIG. 7. Unlike the first type transistor cells 10 the second type transistor cell 10' illustrated in FIGS. 6 and 7 does not conduct a current when the drive voltage $V_{GS}$ is higher than the threshold voltage applied between the gate node G and the source node S and when a load path voltage $V_{DS}$ is applied that biases the transistor device in a forward state. A load path voltage $V_{DS}$ that biases the transistor device 1 in a forward state is a load path voltage $V_{DS}$ with a polarity that reverse-biases a pn-junction between the body regions 13 and the drift region 11 of the first and second type transistor cells 10, 10'. In an n-type MOSFET, for example, a load path voltage $V_{DS}$ that reverse-biases this pn-junction (and forward-biases the transistor device 1) is a positive voltage between the drain node D and the source node S. When a load path voltage $V_{DS}$ is applied between the drain node D and the source node S that forward-biases this pn-junction between the body regions 13 and the drift region 11 (and, therefore, reverse-biases the transistor device 1), the transistor device 1 conducts independently of the drive voltage $V_{GS}$. In this operating mode, the second type transistor cell 10' illustrated in FIGS. 6 and 7 conducts a current. The on-resistances $R_{DS\_ON1}$, $R_{DS\_ON2}$ of the first and second active device regions 110, 120 explained above are resistances between the source conductor 21 and the drain electrode 33 in an on-state and forward-biased state of the transistor device 1.

The presence of the at least one second type transistor cell 10' in the second active device region 120 increases the on-resistance of the arrangement with the plurality of transistor cells 10, 10' in the second active device region 120 as compared to a scenario in which the second active device region 120 only includes first type transistor cells 10. Thus, by suitably selecting the number of second type transistor cells 10' implemented in the second active device region 120 the area specific on-resistance $A2 \cdot R_{DS\_ON2}$ of the second active device region 120 can be increased as compared to the area specific on-resistance $A1 \cdot R_{DS\_ON1}$ of the first active device region 110 which, according to one example, only includes first type transistor cells 10.

The second active device region 120 may include a plurality of first type transistor cells 10 and a plurality of second type transistor cells 10'. According to one example, a ratio between a number of the first type transistor cells 10 and a number of second type transistor cells in the second active device region 120 is selected from between 20:1 and 1:20 or 10:1 and 1:10. By suitably adjusting this ratio, the area specific on-resistance of the second active device region 120 can be adjusted.

FIG. 8 shows another example of how the second type transistor cell 10' may be implemented, wherein two second type transistor cells 10' are shown in FIG. 8. The second type transistor cells 10' shown in FIG. 8 are different from the first type transistor cells 10 in that the gate electrodes 15 are connected to the source conductor 21. These second type transistor cells 10' can be implemented with source regions (illustrated in dashed lines in FIG. 8) or without source regions. Connecting the gate electrodes 15 to the source electrode 21 has the same effect as omitting the source region. That is, the second type transistor cells 10' shown in FIG. 8 does not contribute to the current conduction when the transistor device 1 is in the on-state and forward-biased. However, the second type transistor cells 10' contribute to the current conduction when the transistor device is in reverse-biased.

Figure 9:
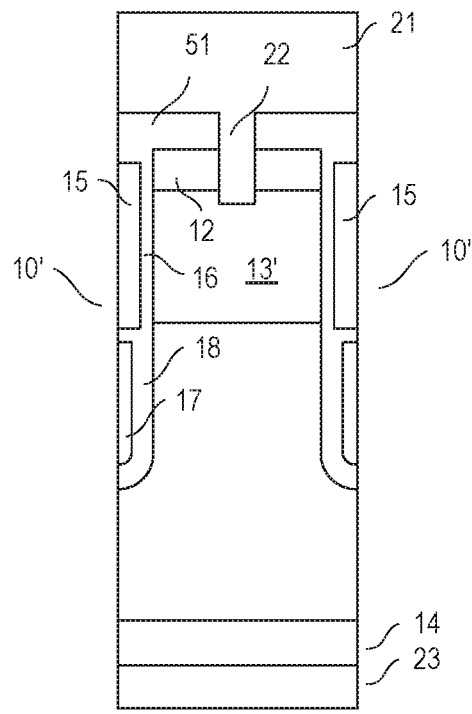

FIG. 9 shows one example of two second type transistor cells 10' that are different from the first type transistor cells 10 in that these second type transistor cells 10' have a higher threshold voltage than the first type transistor cells 10. Because of this, these second type transistor cells 10', at a given drive voltage $V_{GS}$, have a higher on-resistance than the first type transistor cells 10. Thus, by suitably selecting the number of second type transistor cells 10' in the second active device region 120 the area specific on-resistance of the second active device region 120 can be increased as compared to the first area specific on-resistance. In the second type transistor cells 10' shown in FIG. 9, the higher threshold voltage is achieved by implementing the body regions 13' of these transistor cells 10' with a higher doping concentration than the body regions 13 of the first type transistor cells 10.

Figure 10:
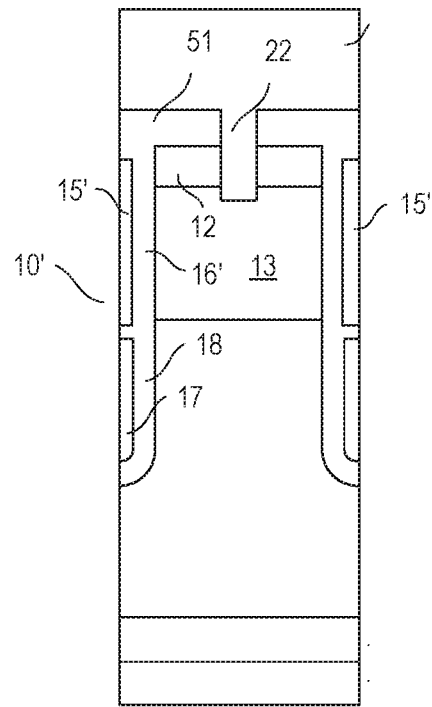

Alternatively, as illustrated in FIG. 10, a higher threshold voltage can be achieved by implementing the gate dielectric 16' of the second type transistor cells 10' thicker than the dielectric 16 of the first type transistor cells 10. A thicker gate dielectric may result in a narrower gate electrode 15'. Of course, a body region 13' with a higher doping concentration as illustrated in FIG. 9 can be combined with a thicker gate dielectric 16' as illustrated in FIG. 10 in one second type transistor cell 10'.

The drift regions 11 of each of the first type transistor cells 10 and the second type transistor cells 10' in the first and second active device regions 110, 120 can be formed by one doped semiconductor region, and the drain regions 14 of the first type transistor cells 10 and the second type transistor cells 10' in the first active device region 110 and the second active device region 120 can be formed by one doped semiconductor region.

In the example illustrated in FIG. 6, the second active device region 120 includes at least one first type transistor cell 10 and at least one second type transistor cell 10'. According to one example, a plurality of first type transistor cells 10 and a plurality of second type transistor cells 10' are implemented in the second active device region 120. The second type transistor cells 10' can be of the same type. According to another example, different types of second type transistor cells are integrated in the second active device region 120.

Figure 11:
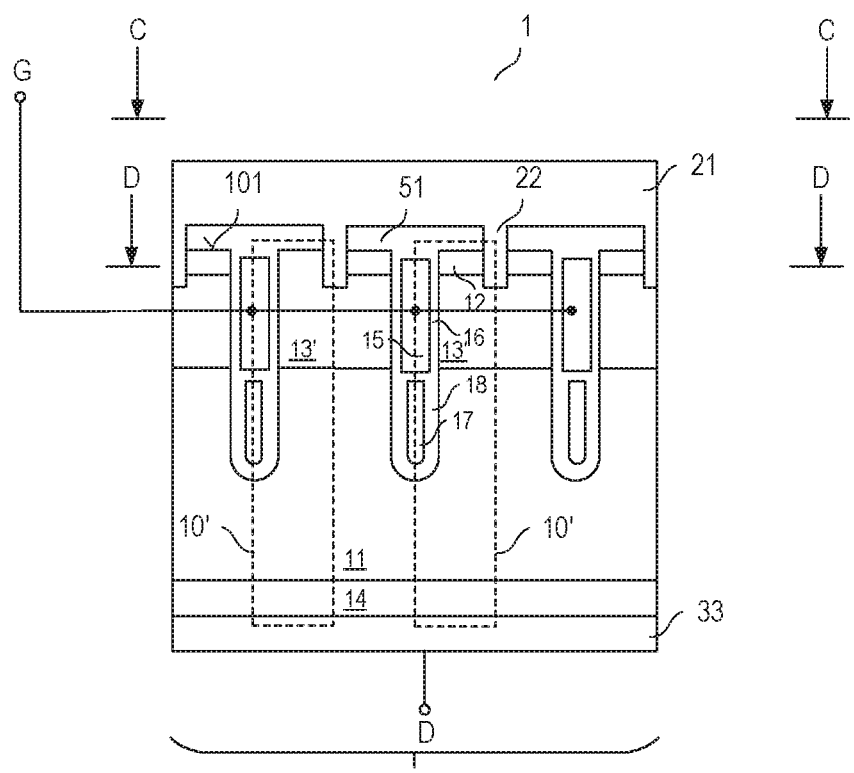
FIG. 11 illustrates a vertical cross sectional view of a second active device region that only includes second type transistor cells.

According to a further example illustrated in FIG. 11, the second active device region 120 only includes second type transistor cells 10', wherein at least some of these second type transistor cells 10' are such that they conduct a current when the transistor device 1 is in the on-state and forward-biased. Second type transistor cells 10' that conduct a current in this operating state are second type transistor cells like those illustrated in FIGS. 9 and 10, for example. These second type transistor cells that conduct a current when the transistor device 1 is in the on-state and forward-biased can be combined with second type transistor cells 10' that only conduct a current when the transistor device is reverse-biased. This is illustrated in FIG. 11 that shows one second type transistor cell 10' that is in accordance with FIG. 9 and one second type transistor cell 10' that is in accordance with FIG. 7. According to another example (not shown) only second type transistor cells 10' that conduct a current when the transistor device 1 is in the on-state and forward-biased are implemented in the second active device region 120.

Examples of the first type transistor cells 10 and the second type transistor cells 10' are explained above with reference to vertical cross sectional views of these transistor cells 10, 10'. In a horizontal plane D-D of the semiconductor body 100, which is a plane parallel to the first surface 101 and the second surface 102, the transistor cells can be implemented in various ways. Two examples are explained with reference to FIGS. 12 and 13 in the following. These figures show examples of the first type transistor cells 10. However, these examples also equivalently apply to the second type transistor cells 10'.

Figure 12:
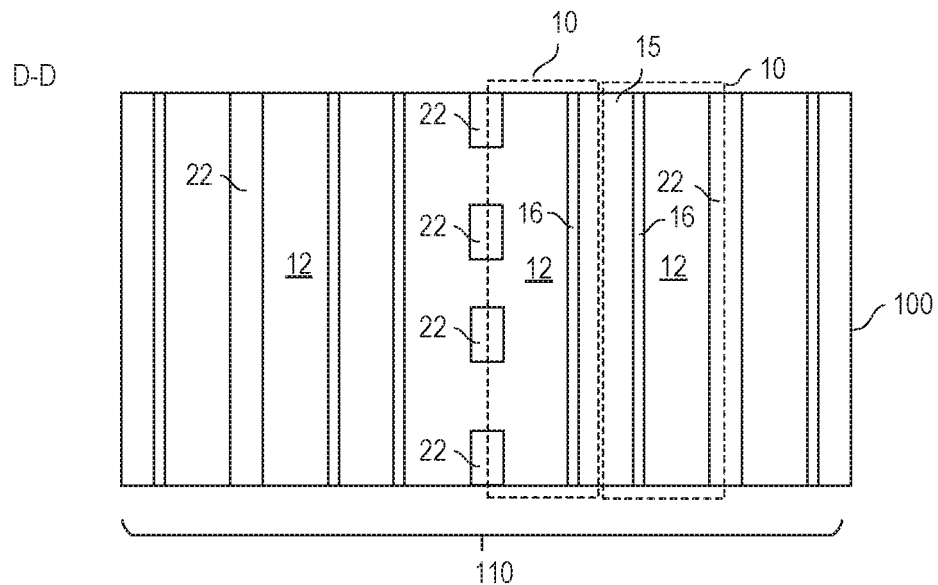
FIG. 12 shows a horizontal cross sectional view of a section of the first device region according to one example.

In the example shown in FIG. 12, the transistor cells 10 are elongated transistor cells. In this example, the gate electrodes 15 are elongated electrodes that are essentially parallel in the horizontal plane D-D. The source regions 12 and the body regions 13 (out of view in FIG. 12) are elongated regions running in parallel with the gate electrodes 15. The contact plugs 22 connecting the source and body regions to the source conductor can be elongated, as illustrated in one example shown in FIG. 12. Optionally, the contact plug 22 may include several plug sections spaced apart from each other in a longitudinal direction of the source regions 12, as illustrated in another example shown in FIG. 12.

Figure 13:
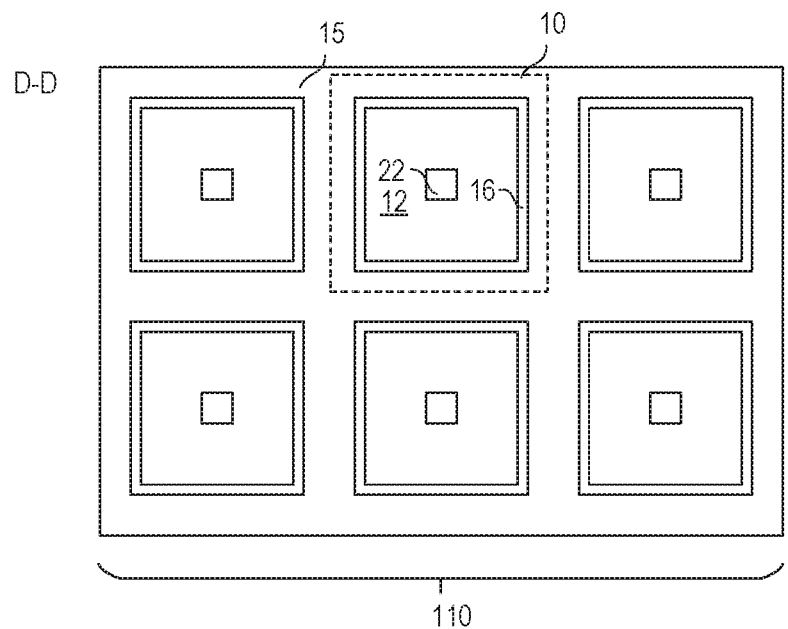
FIG. 13 shows a horizontal cross sectional view of a section of the first device region according to another example.

FIG. 13 shows a horizontal cross sectional view of one section of the transistor device 1 according to another example. In this example, one grid-shaped electrode forms the gate electrodes 15 of each of the transistor cells 10, wherein source regions 12 and body regions (out of view in FIG. 13) are formed in "openings" of the grid-shaped electrode. Just for the purpose of illustration, the grid-shaped electrode in the example illustrated in FIG. 13 is implemented such that it includes rectangular openings. This, however, is only an example. A grid-shaped electrode forming other types of openings such as, for example, hexagonal openings may be implemented as well.

Figure 14:
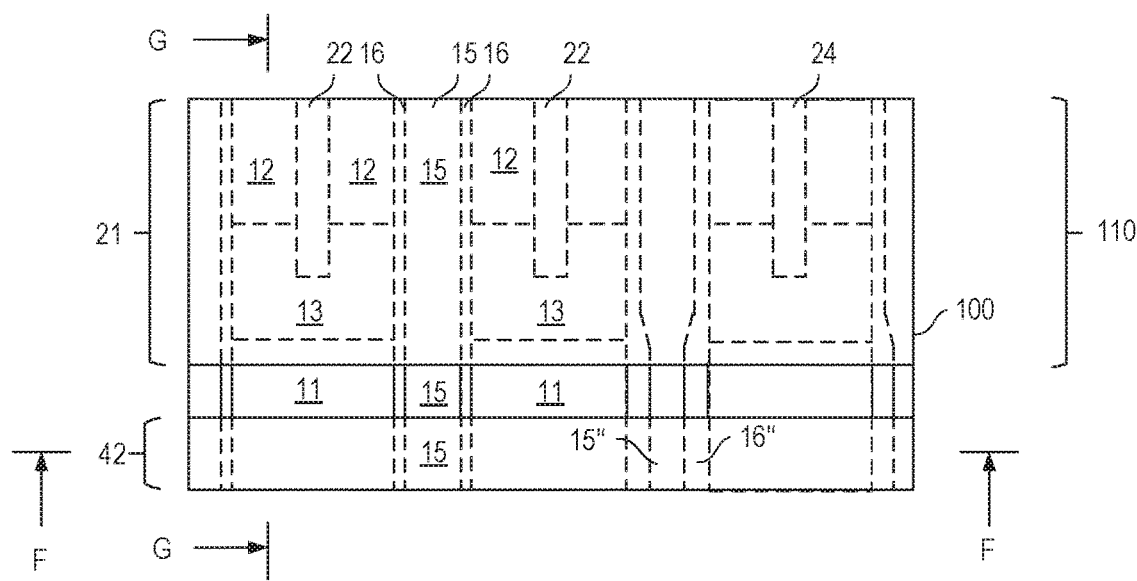
FIG. 14 shows a top of one section of the source conductor and a gate runner.

The gate electrodes 15 of the first type transistor cells 10 and the gate electrodes of at least some types of the second type transistor cells (the second type transistor cells shown in FIGS. 7, 9 and 10) are electrically connected to the gate pad 41. One example of how the transistor cells can be connected to the gate pad 41 is illustrated in FIG. 14 that shows a top view of one section of the transistor device 1. In this example, the transistor device 1 includes a gate connector 42 that is connected to the gate electrodes of the transistor cells. In this example, the gate connector 42 is spaced apart from the source conductor 21 in a horizontal direction of the semiconductor body 100. Source regions 12, body regions 13, gate electrodes 15 and gate dielectrics 16 of transistor cells located below the source conductor 21 are illustrated in dashed lines in FIG. 14. These transistor cells are first type transistor cells in this example. This, however, is only an example. Gate electrodes of second type transistor cells can be connected to a gate connector in the same way. Further, in this example, the transistor cells are elongated transistor cells. The gate connector 42 is an elongated conductor that crosses the gate electrodes 15. According to one example, the gate connector 42 is essentially perpendicular to the gate electrodes 15.

Figure 15:
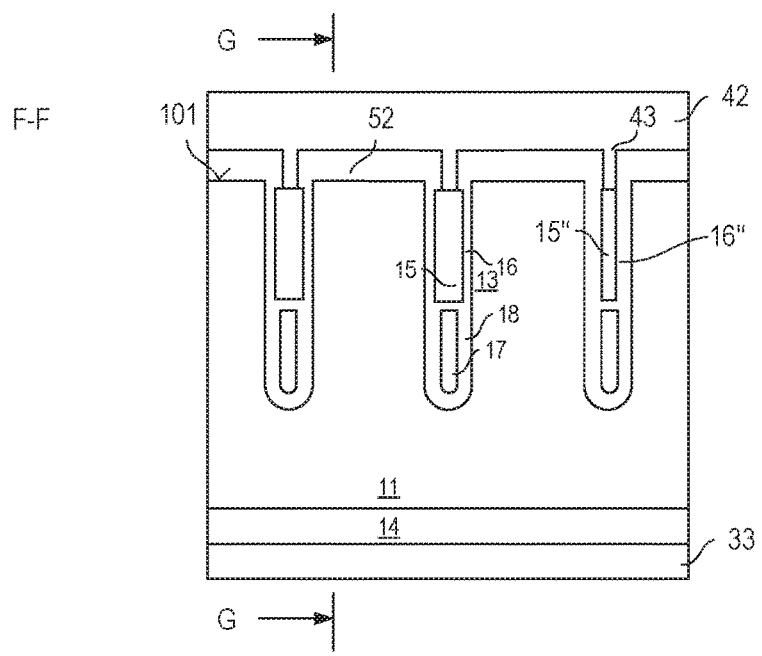
FIG. 15 shows a vertical cross sectional view of one section of the transistor device in which the gate runner is connected to gate electrodes.

FIG. 15 shows a vertical cross sectional view of the gate connector 42 and the semiconductor body 100 in a section plane F-F shown in FIG. 14. Referring to FIG. 15, the gate connector 42 is arranged on top of the first surface 101 of the semiconductor body 100 and is insulated from the semiconductor body 100 by an insulation layer 52. This insulation layer 52 and the insulation layer 51 explained above can be formed by the same layer. Further, the gate connector 42 includes contact plugs 43 that extend through the insulation layer 52 down to the gate electrodes 15. According to one example, as illustrated in FIG. 14, the gate electrodes 15, in a horizontal direction, extend beyond the source conductor 21, while the source regions 12 and the body region 13 terminate below the source conductor 21. According to one example, the gate dielectric 16, in a region where the gate electrode 15 it is connected to the gate connector 42, is thicker than in those regions where it adjoins the source regions 12. In FIGS. 14 and 15, reference number 16" denotes a section of the gate dielectric 16 with a greater thickness. According to one example, a width of the gate trench is essentially the same below the source electrode 21 and below the gate connector 42. In this case, the gate electrode 15 includes a section 15" with a reduced thickness adjoining the thicker gate dielectric section 16". According to another example (not shown), the gate trench may be wider below the gate connector 42 so that the gate electrode 15 may have essentially the same width below the gate connector and the source electrode 21 and the gate dielectric 16 may be thicker below the gate connector 42 than below the source electrode 21.

Figure 16:
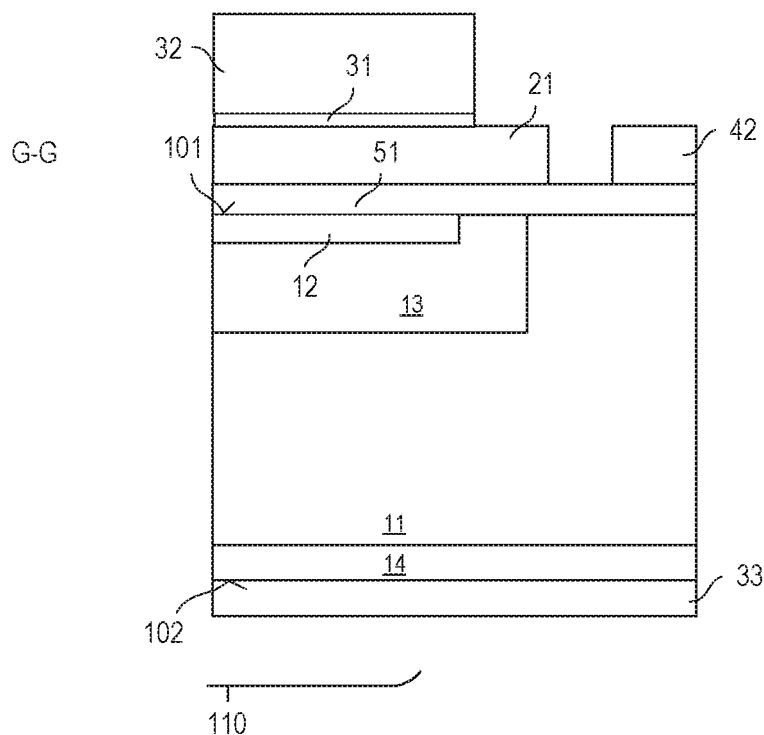
FIG. 16 shows a vertical cross sectional view in a section plane G-G illustrated in FIG. 15.

FIG. 16 shows a vertical cross sectional view of the transistor device shown in FIGS. 14 and 15 in a vertical section plane G-G that is parallel to the gate electrodes 15 and cuts through the source regions 12 and the body regions 13. In FIG. 16, besides the source conductor 21 and the gate connector 42, the source clip 32 is also illustrated. In his example, an edge of the source clip 32 is spaced apart from an edge of the source conductor 21. This, however, is only an example. According to another example, the source clip 32, in the lateral direction, extends to the edge of the source conductor 21. The "edge" of the source conductor 21 terminates the source conductor 21 in the lateral direction. Equivalently, the "edge" of the source clip 32 also terminates the source clip 32 in the lateral direction. The "lateral direction" is a direction parallel to the first and second surfaces 101, 102 of the semiconductor body 100.

Figure 17:
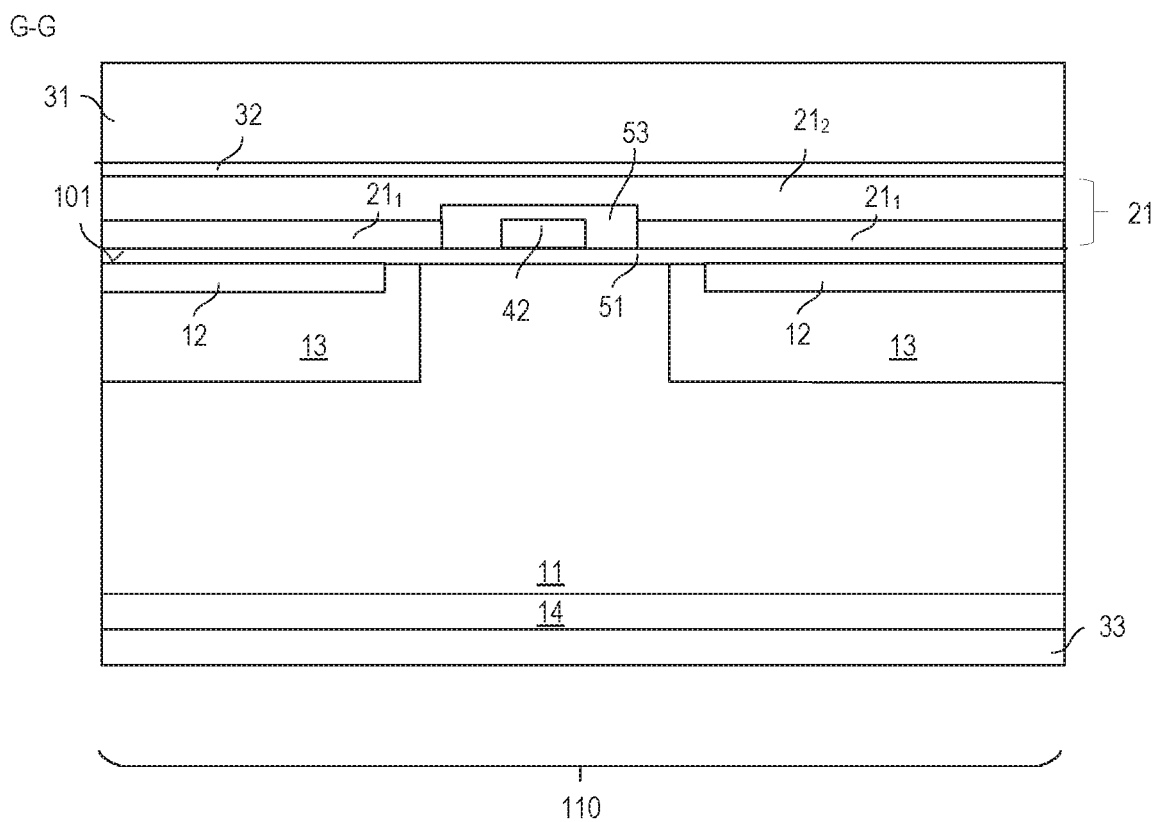
FIG. 17 illustrates one example in which the gate runner is embedded in the source conductor.

FIG. 17 shows a modification of the arrangement illustrated in FIGS. 14 to 16. In the example shown in FIG. 17, the gate connector 42 is embedded in the source conductor 21. That is, a section of the source conductor 21 covers the gate connector 42 wherein the source conductor 21 is electrically insulated from the gate connector 42 by an insulation layer 53. According to one example, the source conductor 21 includes two electrically conducting layers, a first layer $21_1$ and a second layer $21_2$ formed above the first layer $21i$. According to one example, the first layer $21_1$ is an AlCu layer and the second layer $21_2$ is a Cu layer. The gate connector 42 can be formed by the same material as the first layer $21_1$ of the source conductor 21. According to one example, the first layer $21_1$ of the source conductor 21 and the gate connector 42 are formed by the same manufacturing process. FIG. 17 shows a vertical cross sectional view of the transistor device 1 in a section plane that is equivalent to the section plane G-G shown in FIG. 16, so that in FIG. 17 the gate connector 42, but not the gate electrodes 15 and the contact plugs 43 are shown.

FIG. 17 shows a vertical cross sectional view of the first active device region 110, the source conductor 21 and the contact clip 31. However, transistor cells in the second active device region 120 can be connected to a gate connector in the same way.

Referring to FIG. 17, source regions 12 may be omitted below the gate connector 42. That is, the transistor cells do not extend to below the gate connector 42. Thus, the active device region 110 may include inactive regions below the gate connector 42. These inactive regions increase the area specific on-resistance of the first active device region 110 shown in FIG. 17 as compared to an active device region 110 that does not include inactive regions. According to one example, gate electrodes in the first active device region 110 and the second active device region 120 are connected to a gate connector in the same way. The transistor device includes at least one gate connector. According to one example, there is only one gate connector and the gate electrodes in the first active device region 110 and the second active device region 120 are connected to the one gate connector. According to another example, there are several gate connectors. Each of these several gate connectors may be connected to gate electrodes in the first active device region 110 and the second active device region 120. According to another example, at least one gate connector is only connected to gate electrodes in the first active device region 110 and another gate connector is only connected to gate electrodes in the second active device region 120.

Further, according to one example, a ratio between an overall area of the inactive regions in the first active device region 110 relative to the overall area of the first active device region 110 may essentially be the same as a ratio between inactive regions in the second active device region 120 relative to an overall area of the second active device region 120. In this case, the area specific on-resistance of the second active device region 120 would be the same as the area specific on-resistance of the first active device region 110 if both of these first and second active device regions were only implemented with first type transistor cells. However, dependent on how the gate connectors 42 are implemented, the first active device region 110 may include a greater part of inactive regions in proportion to its overall area than the second active region 120, or the second active device region 120 may include a greater part of inactive regions in proportion to its overall area than the first active region 110. According to one example, the inactive part in each of the first and second active regions 110, 120 is less than 10% or even less than 5% in proportion to the respective overall area. In any case, the area specific on-resistance of the second active device region 120 can be increased relative to the area specific on-resistance of the first active device region 110 by implementing at least some second type transistor cells 10' in the second active device region 120.

Figure 18A:
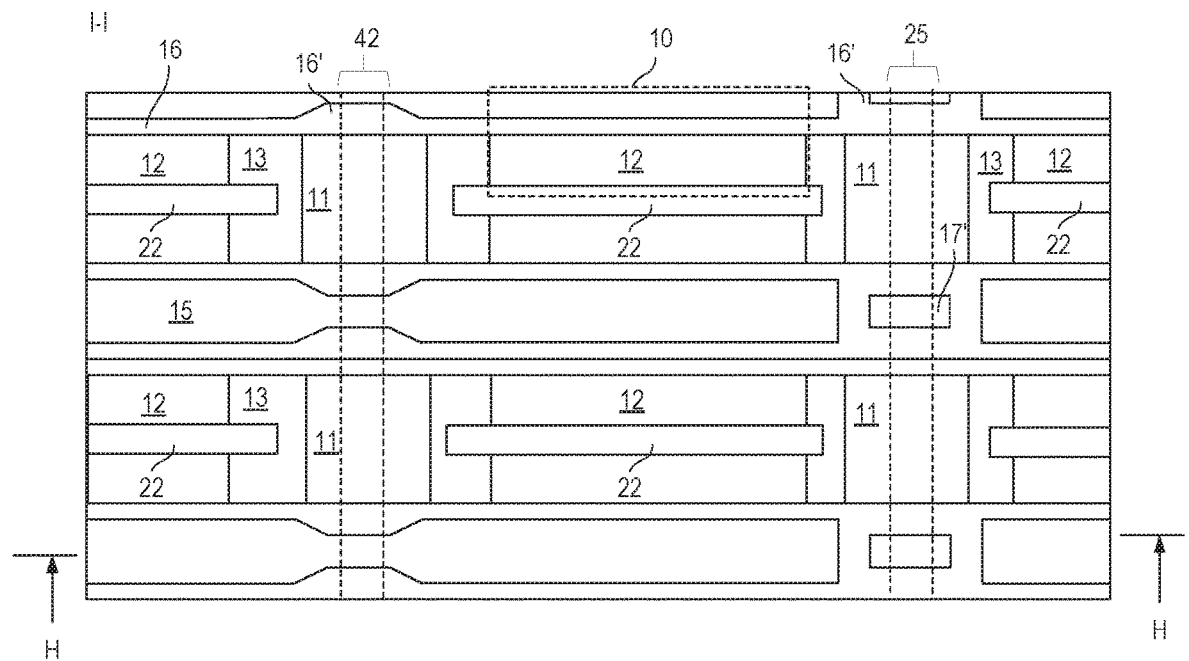
FIGS. 18A and 18B show a top view and a vertical cross sectional of one section in which a gate runner is connected to gate electrodes and a source connector is connected to field electrodes.
Figure 18B:
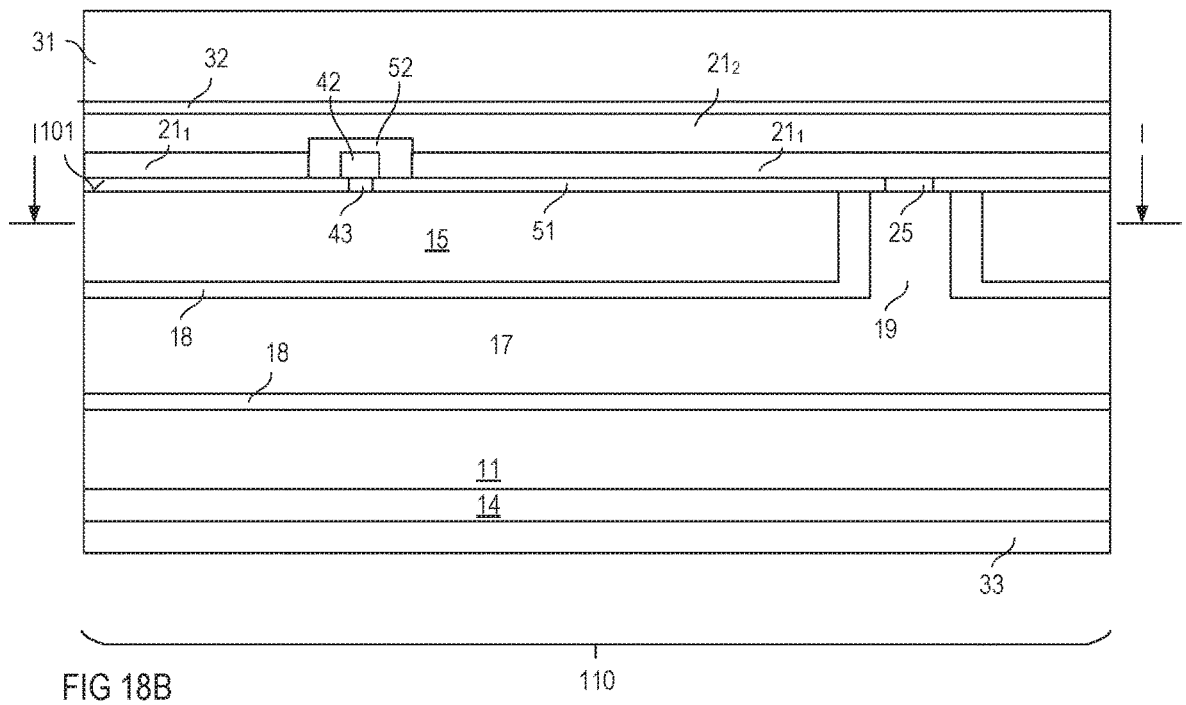

FIGS. 18A and 18B show a horizontal cross sectional view and a vertical cross sectional view, respectively, of a modification of the transistor device explained with reference to FIG. 17. In this example, each of the transistor cells 10 includes a field electrode 17 arranged below the gate electrode 15 in the semiconductor body 100. Each of these field electrodes 17 includes at least one section 19 where the field electrode 17 extends to the first surface 101 of the semiconductor body 100 and is electrically connected to the source conductor 21 by a contact plug 25 extending through the insulation layer 51. The contact plug 25 can be an elongated plug (as illustrated in dashed lines in FIG. 18A) that is connected to the field electrodes 17 and to the body regions 13. This elongated contact plug 25 which may also be referred to as source connector, crosses the trenches with the gate electrodes 15 and the field electrodes 17. According to one example, a longitudinal direction of the contact plug 25 is essentially perpendicular to these trenches. According to another example, there are a plurality of contact plugs 25, wherein each of these contact plugs is only connected to the respective field electrode section 19. A region in which the source conductor 21 is connected to the field electrodes 17 via at least one contact plug 25 is referred to as a field electrode contact region in the following, wherein only one field electrode contact region is shown in FIGS. 18A and 18B.

As can be seen from FIG. 18B, the field electrode section 19 extending to the first surface 101 interrupts the gate electrode 15 and is electrically insulated from the gate electrode 15. Thus, each of the gate electrode sections 15 that are separated by the field electrode section 19 are connected to a gate connector 42, according to one example. In FIG. 18A, however, only one of these gate connectors 42 is shown. According to one example, the transistor device includes a plurality of gate connectors 42 and field electrode contact regions, wherein gate connectors 42 and field electrode contact regions are arranged alternatingly.

Referring to FIG. 18A, the source regions 12 can be omitted below the source connectors 25, so that below the source connectors 25, the transistor device includes inactive regions in the same way as below the gate connectors 42. According to one example, a ratio between an overall area of the inactive regions formed below the source connectors 25 in the first active device region 110 relative to an area of the first active device region 110 may essentially be equal to a ratio between an overall area of the inactive regions below the source connectors in the second active device region 120 relative to an area of the second active device region 120. However, dependent on how the source connectors 25 are implemented the first active device region 110 may include a greater part of inactive regions in proportion to its overall area than the second active region 120, or the second active device region 120 may include a greater part of inactive regions in proportion to its overall area than the first active region 110. According to one example, the inactive part in each of the first and second active regions 110, 120 is less than 10% or even less than 5% in proportion to the respective overall area, wherein this inactive part may include inactive regions below gate connectors 42 and/or source connectors 25. In any case, the area specific on-resistance of the second active device region 120 can be increased relative to the area specific on-resistance of the first active device region 110 by implementing at least some second type transistor cells 10' in the second active device region 120.

It should be noted that in each of the examples explained with reference to FIGS. 14 to 18B one gate connector can be connected to gate electrodes 15 of first type transistor cells 10 in the first active device region 100 and to gate electrodes of first type transistor cells 10 and/or second type transistor cells 10' in the second active device region 120.

In the example shown in FIG. 1, the gate pad 41 is arranged on top of the first surface 101 of the semiconductor body 100 close to an edge of the semiconductor body 100 and is adjacent to the source conductor 21 on three sides.

Figure 19:
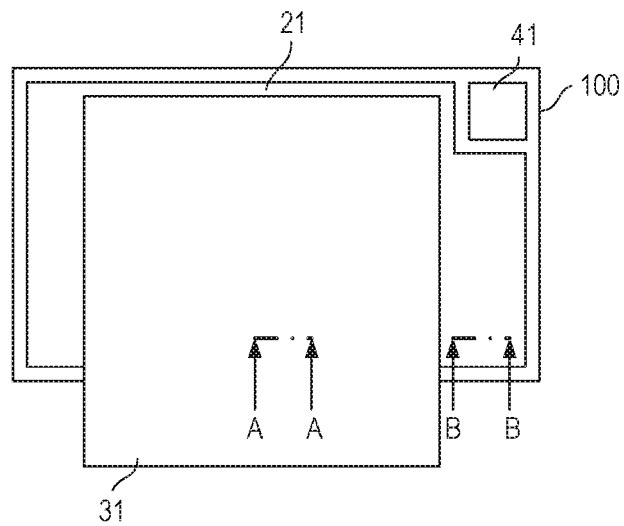
FIGS. 19 to 21 show top views of transistor device including a source conductor and a source clip according to further examples.

According to another example shown in FIG. 19, the gate pad 41 is arranged on top of the first surface 101 in a corner of the semiconductor body 100 so that the gate pad 41 is adjacent to the source conductor 21 only on two of its sides. According to one example, the gate pad 41 in each of these examples is insulated from the semiconductor body 100 by one of the insulation layers 51, 52 explained above and is electrically connected to the at least one gate connector 42.

Figure 20:
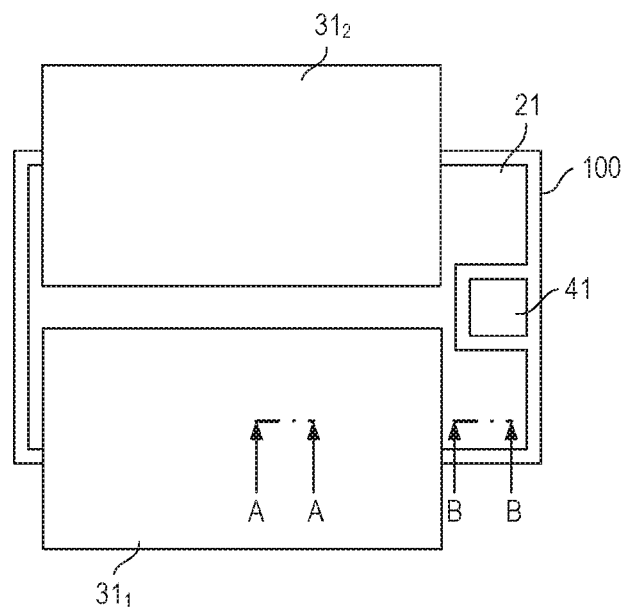

FIG. 20 shows another modification of the transistor device shown in FIG. 1. In this example, the source clip 31 includes two source clip section $31_1$, $31_2$ that are spaced apart from each other.

Figure 21:
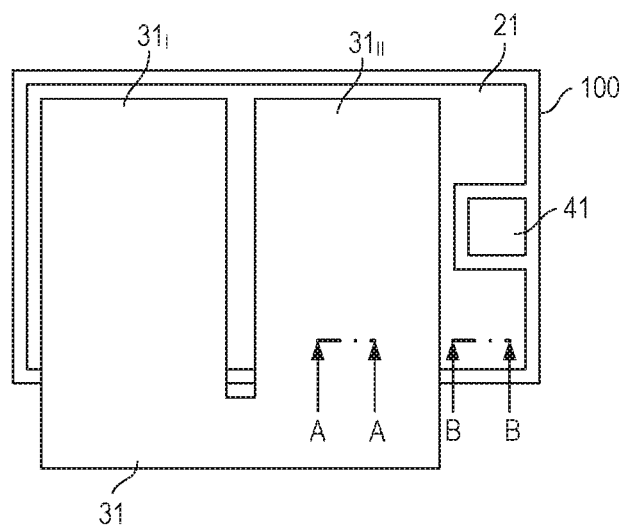

According to another example shown in FIG. 21, the source clip 31 is U-shaped with two legs $31_I$, $31_{II}$. In each of these examples, the first active device region is formed by those regions covered by both the source conductor 21 and the source clip 31, that is, by one of the sections $31_1$, $31_2$ shown in FIG. 20 or by one of the legs $31_I$, $31_{II}$ shown in FIG. 21.

Figure 22:
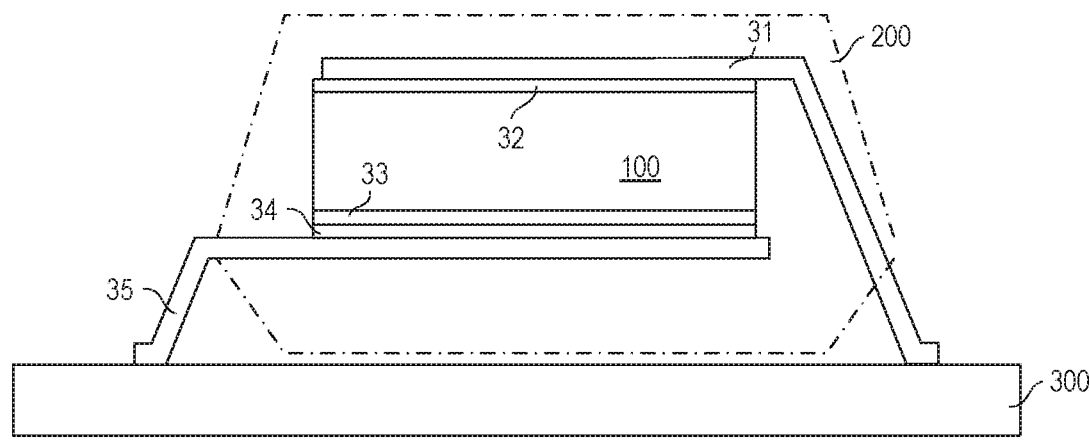
FIG. 22 illustrates a vertical cross sectional view of the transistor device and a housing encapsulating the semiconductor body of the transistor device.

Referring to FIG. 22, the transistor device 1 may include a housing 20 that encapsulates the semiconductor body 100. The housing 200 may include a molding compound such as an epoxy based molding compound. A section of the source clip 31 may protrude from the housing 200 and can be connected to a carrier 300 such as a PCB. Referring to FIG. 22, the drain electrode 33 may be mounted on an electrically conducting carrier 35, wherein mounting the drain electrode 33 onto the carriers 35 may include one of soldering or gluing so that a solder or glue/adhesive layer 34 is formed between the drain electrode 33 and the carrier 35. The electrically conducting carrier 35 can be implemented as a lead frame and may include a leg protruding from the housing 20. The transistor device may include another leg (not shown in FIG. 22) that protrudes from the housing 200 and is electrically connected to the gate pad 41. This leg can be connected to the gate pad 41 by a bond wire, a flat conductor, or the like.

Figure 23:
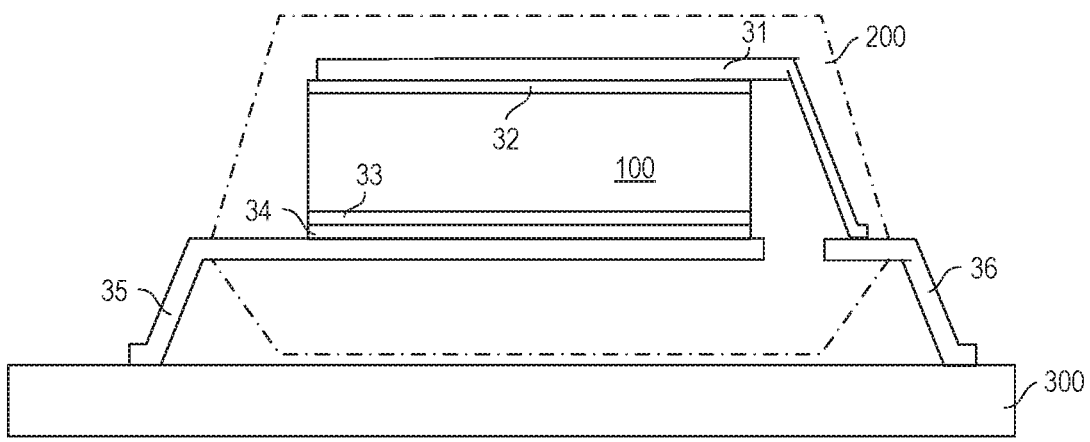
FIG. 23 illustrates a modification of the transistor device shown in FIG. 22.

According to another example shown in FIG. 23, the source clip 31 is connected to another conductor 36 inside the housing 200 and the other conductor 36 protrudes from the housing. According to one example, the other conductor 36 is a section of the lead frame that is not connected to the section 35 on which the drain electrode 33 is mounted.

Figure 24:
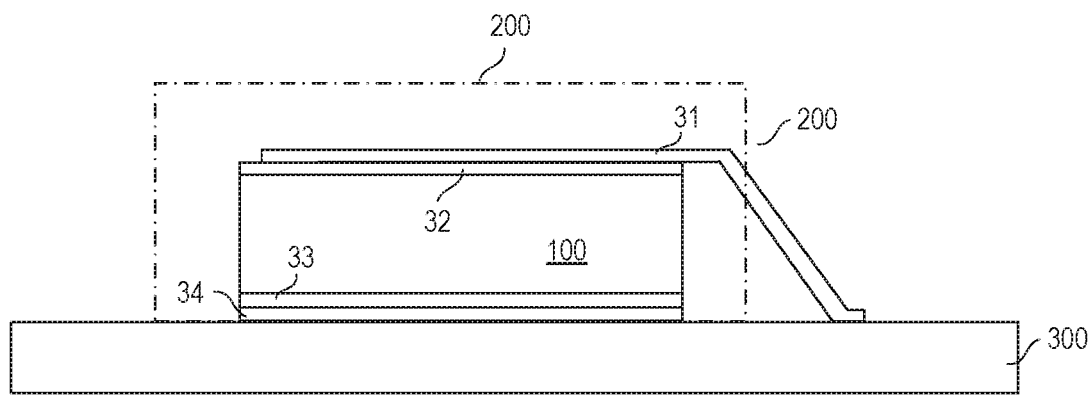
FIG. 24 illustrates a further modification of the transistor device shown in FIG. 22.

FIG. 24 shows a modification of the transistor device shown in FIG. 23. In this example, the drain electrode 33 is directly mounted to the carrier 300. The housing 200 is optional in this case.

Although the present disclosure is not so limited, the following numbered examples demonstrate one or more aspects of the disclosure.

Example 1

A transistor device, including: a semiconductor body; a source conductor on top of the semiconductor body; a source clip on top of the source conductor and electrically connected to the source conductor; a first active device region arranged in the semiconductor body, covered by the source conductor and the source clip and including at least one device cell; and a second active device region arranged in the semiconductor body, covered by regions of the source conductor that are not covered by the source clip and including at least one device cell, wherein the first active device region has a first area specific on-resistance, wherein the second active device region has a second area specific on-resistance, and wherein the second area specific on-resistance is greater than the first area specific on-resistance.

Example 2

The transistor device of example 1, wherein a ratio between the second area specific on-resistance and the first area specific on-resistance is at least 1.2, at least 1.5, at least 2, or at least 5.

Example 3

The transistor device of any combination of examples 1 to 2, wherein the at least one device cell of the first active device region includes at least one first type transistor cell, wherein the at least one first type transistor cell includes: a drift region; a source region connected to the source conductor; a body region arranged between the source region and the drift region; and a gate electrode adjacent the body region, dielectrically insulated from the body region by a gate dielectric, and connected to a gate node.

Example 4

The transistor device of any combination of examples 1 to 3, wherein the at least one first type transistor cell further includes: a field electrode adjacent the drift region and dielectrically insulated from the drift region by a field electrode dielectric.

Example 5

The transistor device of any combination of examples 1 to 4, wherein the at least one device cell of the second active device region includes at least one second type transistor cell that is different from the first type transistor cell.

Example 6

The transistor device of any combination of examples 1 to 5, wherein the at least one device cell of the second active device region further include at least one first type transistor cell.

Example 7

The transistor device of any combination of examples 1 to 6, wherein the second type transistor cell is different from the first type transistor cell in at least one feature selected from the group consisting of: a doping concentration of a body region of the second type transistor cell is higher than a doping concentration of the body region of the first type transistor cell; or a gate dielectric of the second type transistor cell is thicker than the gate dielectric of the first type transistor cell.

Example 8

The transistor device of any combination of examples 1 to 7, wherein the second type transistor cell is different from the first type transistor cell in at least one feature selected from the group consisting of: a gate electrode of the second type transistor cell is connected to the source conductor; or the second type transistor cell does not include a source region.

Example 9

The transistor device of any combination of examples 1 to 8, wherein the first active device region only includes the at least one first type transistor cell.

Example 10

The transistor device of any combination of examples 1 to 9, wherein the second active device region includes a plurality of first type transistor cells and a plurality of second type transistor cells, wherein a ratio between a number of first type transistor cells and a number of second type transistor cells in the second active device region is between 20:1 and 1:20.

Example 11

The transistor device of any combination of examples 1 to 10, wherein a ratio between a size of the first active device region and a size of the second active device region is greater than 5 or greater than 10.

Example 12

The transistor device of any combination of examples 1 to 11, further including: a gate pad arranged on top of the semiconductor body and spaced apart from the source conductor; and at least one gate connector electrically connected to the gate pad and the gate electrode of the at least one first type transistor cell.

Example 13

The transistor device of any combination of examples 1 to 12, wherein the gate connector is spaced apart from the source conductor in a horizontal direction of the semiconductor body.

Example 14

The transistor device of any combination of examples 1 to 13, wherein the gate connector is embedded in the source conductor and electrically insulated from the source conductor 21.

Example 15

The transistor device of any combination of examples 1 to 14, wherein the first area specific on-resistance is given by an electrical resistance of the at least one device cell implemented in the first active device region in an on-state of the transistor device multiplied with an area of the first active device region, and wherein the second area specific on-resistance is given by an electrical resistance of the at least one device cell implemented in the second active device region in the on-state of the transistor device multiplied with an area of the second active device region.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
   a semiconductor body;
   a source conductor on top of the semiconductor body;
   a source clip on top of the source conductor and electrically connected to the source conductor;
   a first active device region arranged in the semiconductor body, covered by the source conductor and the source clip, and comprising at least one device cell; and
   a second active device region arranged in the semiconductor body, covered by regions of the source conductor that are not covered by the source clip, and comprising at least one device cell,
   wherein the first active device region has a first area specific on-resistance,
   wherein the second active device region has a second area specific on-resistance,
   wherein the second area specific on-resistance is greater than the first area specific on-resistance.

2. The transistor device of claim 1, wherein a ratio between the second area specific on-resistance and the first area specific on-resistance is at least 1.2, at least 1.5, at least 2, or at least 5.

3. The transistor device of claim 1, wherein the at least one device cell of the first active device region comprises at least one first type transistor cell, and wherein the at least one first type transistor cell comprises:
   a drift region;
   a source region connected to the source conductor;
   a body region arranged between the source region and the drift region; and
   a gate electrode adjacent the body region, dielectrically insulated from the body region by a gate dielectric, and connected to a gate node.

4. The transistor device of claim 3, wherein the at least one first type transistor cell further comprises a field electrode adjacent the drift region and dielectrically insulated from the drift region by a field electrode dielectric.

5. The transistor device of claim 3, wherein the at least one device cell of the second active device region comprises at least one second type transistor cell that is different from the first type transistor cell.

6. The transistor device of claim 5, wherein the at least one device cell of the second active device region further comprises at least one of the first type transistor cell.

7. The transistor device of claim 6, wherein the second type transistor cell is different from the first type transistor cell in at least one feature selected from the group consisting of:
   a gate electrode of the second type transistor cell is connected to the source conductor; and
   the second type transistor cell does not comprise a source region.

8. The transistor device of claim 6, wherein the second active device region includes a plurality of the first type transistor cells and a plurality of the second type transistor cells, and wherein a ratio between a number of the first type transistor cells and a number of the second type transistor cells in the second active device region is between 20:1 and 1:20.

9. The transistor device of claim 5, wherein the second type transistor cell is different from the first type transistor cell in at least one feature selected from the group consisting of:
   a doping concentration of a body region of the second type transistor cell is higher than a doping concentration of the body region of the first type transistor cell; and
   a gate dielectric of the second type transistor cell is thicker than the gate dielectric of the first type transistor cell.

10. The transistor device of claim 3, wherein the first active device region only comprises the at least one first type transistor cell.

11. The transistor device of claim 3, further comprising:
    a gate pad arranged on top of the semiconductor body and spaced apart from the source conductor; and
    at least one gate connector electrically connected to the gate pad and the gate electrode of the at least one first type transistor cell.

12. The transistor device of claim 11, wherein the at least one gate connector is spaced apart from the source conductor in a horizontal direction of the semiconductor body.

13. The transistor device of claim 11, wherein the at least one gate connector is embedded in the source conductor and electrically insulated from the source conductor.

14. The transistor device of claim 1, wherein a ratio between a size of the first active device region and a size of the second active device region is greater than 5 or greater than 10.

15. The transistor device of claim 1, wherein the first area specific on-resistance is given by an electrical resistance of the at least one device cell implemented in the first active device region in an on-state of the transistor device multiplied with an area of the first active device region, and wherein the second area specific on-resistance is given by an electrical resistance of the at least one device cell implemented in the second active device region in the on-state of the transistor device multiplied with an area of the second active device region.

* * * * *